(12) United States Patent
Shin

(10) Patent No.: US 10,120,794 B2
(45) Date of Patent: Nov. 6, 2018

(54) STORAGE DEVICE INCLUDING BUFFER AND MAIN MEMORIES, AND USER DEVICE INCLUDING THE SAME

(71) Applicant: Dongjun Shin, Hwaseong-si (KR)

(72) Inventor: Dongjun Shin, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 292 days.

(21) Appl. No.: 14/993,146

(22) Filed: Jan. 12, 2016

(65) Prior Publication Data

US 2016/0203075 A1 Jul. 14, 2016

(30) Foreign Application Priority Data

Jan. 13, 2015 (KR) ........................ 10-2015-0006010

(51) Int. Cl.
  *G06F 12/02* (2006.01)
  *G11C 16/10* (2006.01)
  *G11C 7/10* (2006.01)

(52) U.S. Cl.
  CPC ........ *G06F 12/0246* (2013.01); *G11C 7/1039* (2013.01); *G11C 7/1045* (2013.01); *G11C 16/10* (2013.01); *G06F 2212/7201* (2013.01); *G06F 2212/7207* (2013.01); *G11C 7/1087* (2013.01); *G11C 7/1096* (2013.01)

(58) Field of Classification Search
  CPC .... G06F 12/0246; G06F 3/068; G06F 3/0679; G06F 3/061; G06F 3/0613; G06F 3/0634; G06F 3/0635; G06F 3/0655; G06F 3/0658; G06F 3/0659
  See application file for complete search history.

(56) References Cited

U.S. PATENT DOCUMENTS

| | | | |
|---|---|---|---|
| 7,649,822 B2 | 1/2010 | Tamura et al. |
| 7,679,133 B2 | 3/2010 | Son et al. |
| 7,970,981 B2 | 6/2011 | Cheon et al. |
| 8,266,371 B2 | 9/2012 | Toyama |
| 8,553,466 B2 | 10/2013 | Han et al. |
| 8,559,235 B2 | 10/2013 | Yoon et al. |
| 8,654,587 B2 | 2/2014 | Yoon et al. |
| 8,677,058 B2 | 3/2014 | Jung et al. |
| 8,918,580 B2 | 12/2014 | Cheon |

(Continued)

FOREIGN PATENT DOCUMENTS

| | | |
|---|---|---|
| KR | 10-1060258 B1 | 8/2011 |
| KR | 10-2014-0033964 A | 3/2014 |

*Primary Examiner* — Edward J Dudek, Jr.
*Assistant Examiner* — Hewy H Li
(74) *Attorney, Agent, or Firm* — Volentine, Whitt & Francos, PLLC

(57) ABSTRACT

A storage device includes a nonvolatile memory including a buffer region and a main region, and a memory controller responsive to a write request to store successively received blocks of write data at the nonvolatile memory. The memory controller is configured to initially store blocks among the successively received blocks of write data in the main region of the nonvolatile memory, and to subsequently store remaining blocks among the successively receive blocks of write data in the buffer region when a continuity count exceeds a reference count. The continuity count denotes a number of times a data size of the successively received blocks consecutively equals or exceeds a reference data size.

20 Claims, 15 Drawing Sheets

(56) References Cited

U.S. PATENT DOCUMENTS

| | | | |
|---|---|---|---|
| 2008/0016267 A1 | 1/2008 | Oyaizu | |
| 2008/0172521 A1 | 7/2008 | Lee | |
| 2011/0233648 A1 | 9/2011 | Seol et al. | |
| 2012/0005415 A1* | 1/2012 | Jung | G06F 12/0246 711/103 |
| 2012/0246392 A1* | 9/2012 | Cheon | G06F 12/0871 711/103 |
| 2014/0019707 A1* | 1/2014 | Benhase | G06F 12/023 711/171 |
| 2014/0071753 A1* | 3/2014 | Shin | G06F 12/0246 365/185.03 |
| 2014/0078344 A1 | 3/2014 | Yoon et al. | |
| 2014/0089584 A1* | 3/2014 | Pan | G06F 12/08 711/118 |
| 2015/0039789 A1* | 2/2015 | Bisht | G06F 3/0613 710/34 |
| 2015/0347040 A1* | 12/2015 | Mathur | G06F 3/0616 711/103 |

* cited by examiner

STORAGE DEVICE INCLUDING BUFFER AND MAIN MEMORIES, AND USER DEVICE INCLUDING THE SAME

CROSS-REFERENCE TO RELATED APPLICATIONS

A claim for priority under 35 U.S.C. § 119 is made to Korean Patent Application No. 10-2015-0006010 filed Jan. 13, 2015, in the Korean Intellectual Property Office, the entire contents of which are hereby incorporated by reference.

BACKGROUND

Embodiments of the inventive concepts described herein relate to storage devices and user devices including storage devices, and more particularly, to such devices configured to control a write speed according to characteristics of write data to be stored.

There are a multitude of electronic devices, such as personal computers (PCs), digital cameras, camcorders, portable telephones, smart phones, and tablet PCs, which incorporate one or more data storage media. Examples of such storage media include memory cards, universal serial bus (USB) cards, solid state drives (SSDs), embedded MultiMediaCards (eMMCs), universal flash storage (UFS), and the like. The storage media, regardless of type, may include a semiconductor memory to store data therein.

Semiconductor memory is general classified as either volatile or nonvolatile. Volatile memories suffer a loss of stored data in a power-off state, and examples thereof include dynamic random access memory (DRAM), static RAM (SRAM), and the like. In contrast, nonvolatile memories retain stored data even in a power-off state, and examples thereof include flash memory, electrically erasable programmable read-only memory (EEPROM), ferroelectric RAM (FRAM), phase-change RAM (PRAM), magnetoresistive RAM (MRAM), and the like. Flash memory in particular has gained wide popularity as a mass storage device in view of its relatively high programming speed and low power consumption.

SUMMARY

One aspect of embodiments of the inventive concept is directed to provide a storage device which includes a nonvolatile memory including a buffer region and a main region, and a memory controller responsive to a write request to store successively received blocks of write data at the nonvolatile memory. The memory controller is configured to initially store blocks among the successively received blocks of write data in the main region of the nonvolatile memory, and to subsequently store remaining blocks among the successively receive blocks of write data in the buffer region when a continuity count exceeds a reference count. The continuity count denotes a number of times a data size of the successively received blocks consecutively equals or exceeds a reference data size.

N-bit data may be stored at each memory cell of the buffer region, and M-bit data may be stored at each memory cell of the main region, where N and M are integers.

The memory controller may includes a mode manager configured to change a write mode between a first mode in which data is stored at the buffer region and a second mode in which data is stored at the main region. A write speed of the first mode may be greater than a write speed of the second mode. The mode manager may change the write mode to the first mode when the continuity count exceeds a reference count, and the mode manager may change the write mode to the second mode at an idle state. After the mode manager changes the write mode to the first mode and in the absence of the idle state, the memory controller may maintain the first mode regardless of a data size of all of the remaining blocks among the successively received blocks of write data.

The memory controller may be configured to perform a migration operation in which data stored at the buffer region is transferred to the main region. The migration operation may be performed at an idle time.

The nonvolatile memory may be a flash memory having a three-dimensional memory array.

Another aspect of embodiments of the inventive concept is directed to provide a storage device which includes a flash memory including a buffer region and a main region, and a memory controller responsive to a write request to selectively store each of successively received blocks of write data at the buffer region or the main region according to whether a data size of the blocks is continuously greater than or equal to a reference size.

The memory controller may change from a second mode in which the successively received blocks of write data are initially stored in the main memory to a first mode in which remaining successively received blocks of write data are stored in the buffer memory when a continuity count equals or exceeds a reference count. The continuity count denotes a number of times the data size of the successively received blocks consecutively equals or exceeds the reference data size. After an occurrence of an idle state, the memory controller may change to the second mode for execution of a next write request. In the absence of the idle state and after the memory controller stores changes to the first mode, the memory controller may maintain the first mode for storing the remaining successively received blocks of write data in the buffer region regardless of a data size of the remaining successively received blocks of write data.

N-bit data may be stored at each memory cell of the buffer region, and M-bit data is stored at each memory cell of the main region, where N and M are integers.

The memory controller may includes a speed mode manager configured to change between a first write speed mode in which data is stored at the buffer region and a second write speed mode in which data is stored at the main region. The speed mode manager may change from the first write speed mode to the second write speed mode according to whether the data size of the successively received blocks of write data is consecutively greater than or equal to the reference size.

Still another aspect of embodiments of the inventive concept is directed to provide a user device which includes a host configured to provide a write request and successive blocks of write data, and a storage device configured to receive the write request and the successive blocks of write data from the host, and to store the successive blocks of write data at a buffer region or a main region of a flash memory. The storage device is configured to initially store blocks among the successively received blocks of write data in the main region of the flash memory, and to subsequently store remaining blocks among the successively received blocks of write data in the buffer region of the flash memory when a continuity count equals or exceeds a reference count. The continuity count denotes a number of times a data size of the successively received blocks consecutively equals or exceeds a reference data size.

The storage device may include a mode manager configured to change a write mode between a first mode in which data is stored at the buffer region and a second mode in which data is stored at the main region. A write speed of the first mode may be greater than a write speed of the second mode. The mode manager may change the write mode to the first mode when the continuity count equals or exceeds a reference count, and the mode manager may change the write mode to the second mode at an idle state.

After the mode manager changes the write mode to the first mode and in the absence of the idle state, the storage device may maintain the first mode regardless of a data size of all of the remaining blocks among the successively receive blocks of write data.

The host and the storage device may constitute a mobile electronic device.

BRIEF DESCRIPTION OF THE FIGURES

The above and other aspects and features of the inventive concepts will become apparent from the description that follows with reference to the accompanying drawings, in which like reference numerals refer to like elements throughout the various figures unless otherwise specified, and in which.

DETAILED DESCRIPTION

Figure 1:
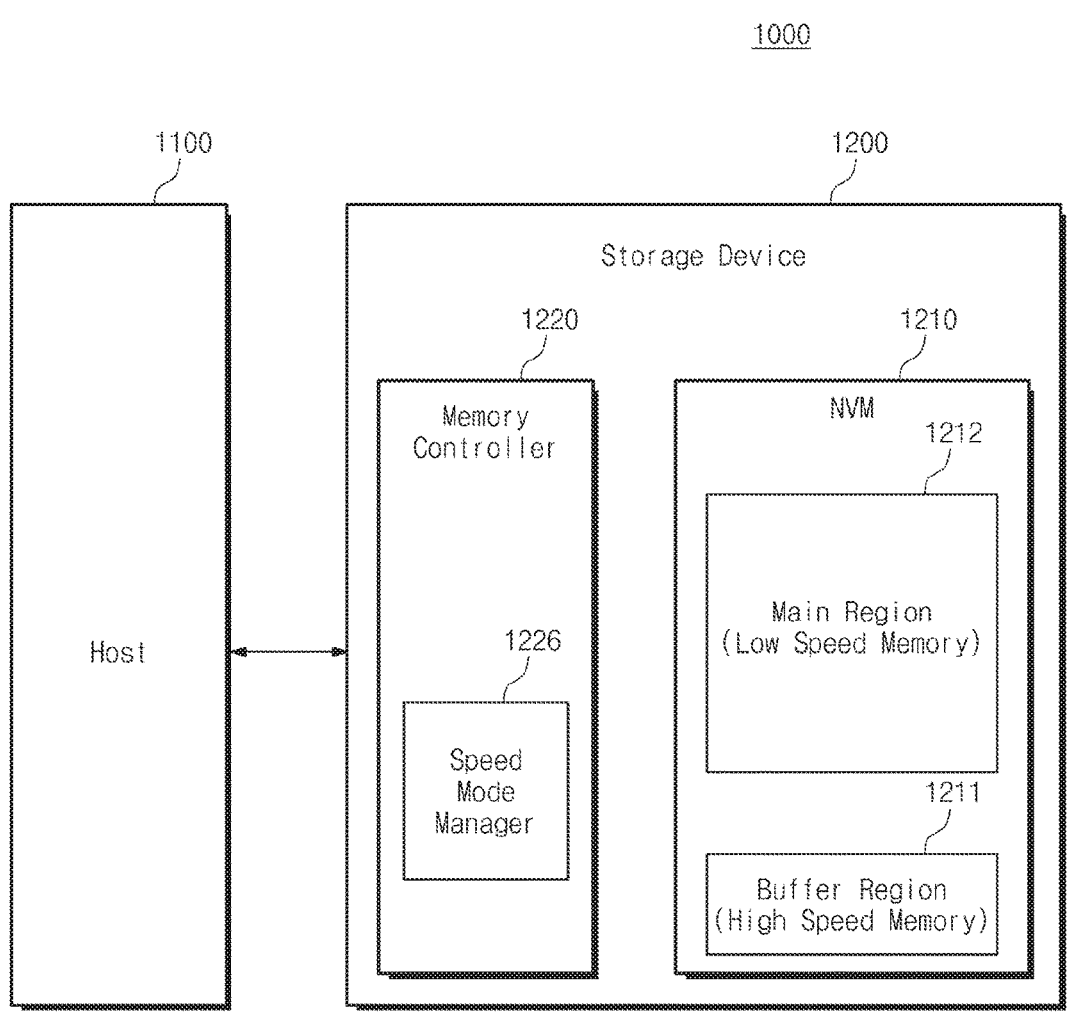
FIG. 1 is a block diagram schematically illustrating a user device according to an exemplary embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or"

includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a user device according to an exemplary embodiment of the inventive concept. Referring to FIG. 1, a user device 1000 may contain a host 1100 and a storage device 1200. The storage device 1200 may include a nonvolatile memory (NVM) 1210 and a memory controller 1220.

The nonvolatile memory 1210 may be controlled by the memory controller 1220 and may perform an operation (e.g., a read operation, a write operation, or the like) corresponding to a request of the memory controller 1220. The nonvolatile memory 1210 may include a buffer region 1211 and a main region 1212. The buffer region 1211 may be implemented with a memory (hereinafter referred to as "high-speed memory") configured or utilized to perform a high-speed write operation, and the main region 1212 may be implemented with a memory (hereinafter referred to as "low-speed memory") configured or utilized to perform a low-speed write operation. Herein, the terms "high-speed" and "low-speed" are relative terms referring to the relative speed (or rate) at which data is written (stored) in a write operation. A write speed of the buffer region 1211 is higher (faster) than a write speed of the main region 1212, and hence the buffer region 1211 is characterized as a high-speed memory and the main region 1212 is characterized as a low speed memory.

The buffer region 1211 may store 1-bit data per memory cell, and the main region 1212 may store N-bit data (N being an integer of 2 or more) per memory cell. In this case, a memory cell of the buffer region 1211 may be referred to as "single level cell" (SLC), and a memory cell of the main region 1212 may be referred to as "multi-level cell" (MLC). Generally, a write speed of an SLC memory is higher than that of an MLC memory. For example, a write speed of an SLC memory may be about two times higher than that of a 2-bit MLC memory, and may be about four times higher than that of a 3-bit MLC memory.

Alternatively, the buffer and main regions 1211 and 1212 may both be formed of MLC memories. In one example of this case, the MLC memory forming the buffer region 1211 may store 1-bit data per memory cell by only performing least significant bit (LSB) program operations. In another example of this case, the MLC memory forming the buffer region 1211 may store N bits per memory cell, while the MLC memory forming the main region 1212 may store more than N bits per memory cell. Meanwhile, the buffer region 1211 and the main region 1212 may be implemented within a single memory device or may be implemented as separate memory devices.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure as the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Still referring to FIG. 1, the memory controller 1220 may contain a speed mode manager 1226. The speed mode manager 1226 may be implemented by software, firmware, hardware, or a combination of at least two thereof. If implemented by software or firmware, the speed mode manager 1226 may run on an internal memory, such as a DRAM.

Figure 2:
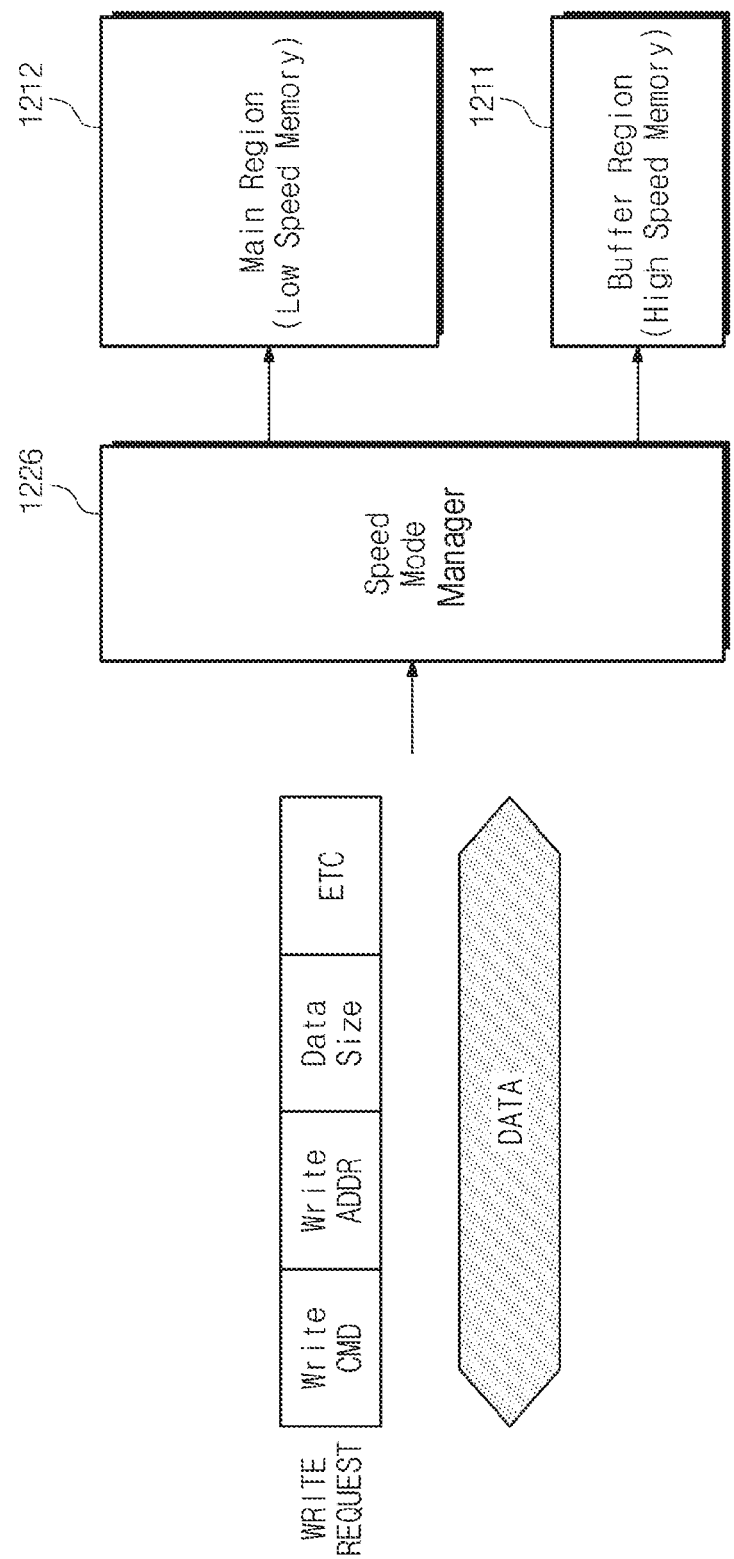
FIG. 2 is a block diagram for reference in exemplarily describing an operation of a user device illustrated in FIG. 1.

FIG. 2 is a block diagram for reference in exemplarily describing an operation of a user device illustrated in FIG. 1. Referring to FIG. 2, a speed mode manager 1226 may receive a write request and data (DATA) from a host 1100 (refer to FIG. 1). The write request may include a command index indicating a write command, a write address, a size of data, and other information ETC.

The speed mode manager 1226 may receive a write request of the host 1100 and may store input data at a buffer region 1211 or a main region 1212, based on information, such as the size of data, data continuity, and the like. For example, the speed mode manager 1226 may store data at the main region 1212 in a normal mode, and may store data at the buffer region 1211 when a size (e.g., number of bits) of data associated with the write request is greater than a predetermined size is sequentially received a predetermined number of times.

When mass data is sequentially received, a user device 1000 according to an exemplary embodiment of the inventive concept may store the mass data at the buffer region 1211 performing a high-speed write operation, thereby enhancing write performance.

Figure 3:
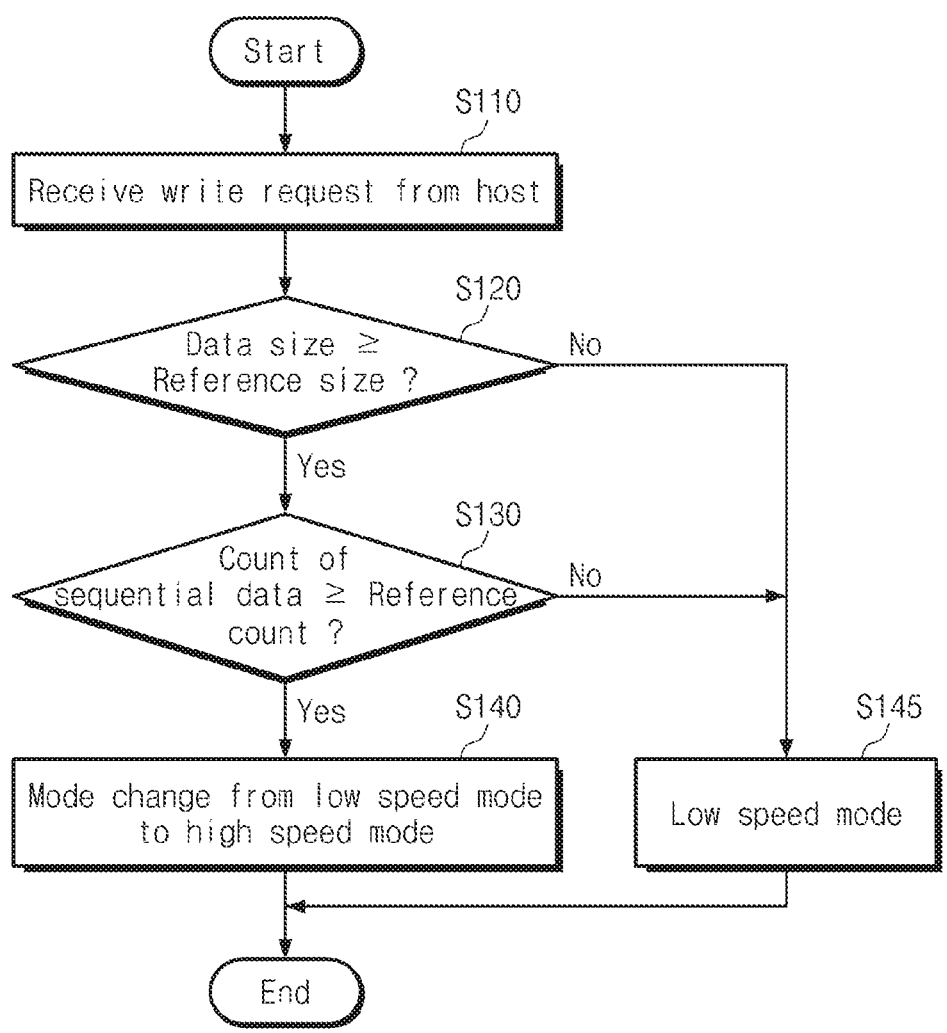
FIG. 3 is a flow chart for reference in describing an operation of a speed mode manager illustrated in FIG. 2.

FIG. 3 is a flow chart for describing an operation of a speed mode manager illustrated in FIG. 2. A speed mode manager 1226 may change a speed mode of a storage device 1200 (refer to FIG. 1) in response to an input of a write request from a host 1100 (refer to FIG. 1). That is, the speed mode manager 1226 may determine whether to store data (transmitted in the form of successive write blocks) from the host 1100 at a buffer region 1211 or at a main region 1212. A write speed in which the write request is executed may be variable according to whether data is stored at the buffer region 1211 or at the main region 1212. Hereinafter, a method for changing a speed mode of the speed mode manager 1226 will be more fully described with reference to FIG. 3.

Figure 4:
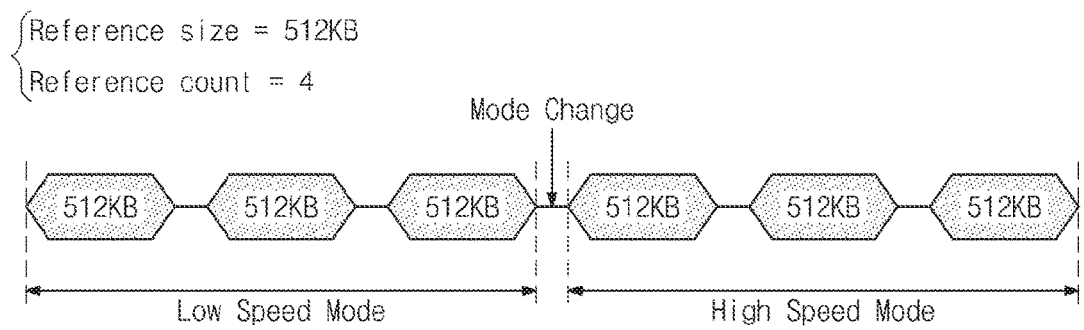
FIG. 4 is a diagram schematically illustrating an example of a mode change operation of a speed mode manager illustrated in FIG. 1.

In step S110, a storage device 1200 may receive a write request from the host 1100. As described with reference to FIG. 2, the write request may include information about a write command, a write address, a size of data, and the like. Here, "size of data" refers to the number of bits of each of successive write blocks (or batches) of write data associated with a write request. For example, FIG. 4 shows six (6) successive write blocks each having a size of 512 kilobytes. That is, the size of data in FIG. 4 is 512 kilobytes.

In step S120 of FIG. 3, the speed mode manager 1226 may determine whether the size of data (i.e., the number of bits of a write block) is greater than or equal to a reference size. In the case where the size of data is smaller than the reference size (No), in step S145, data may be stored at the main region 1212 in which a write operation is performed in a low speed. That is, when the size of the data is smaller than the reference size, data may be stored at the main region 1212 in which a write operation is performed in a low speed. In contrast, when the size of the data is greater than or equal to the reference size (Yes), the method proceeds to step S130.

In step S130, the speed mode manager 1226 may determine whether a continuity count equals or exceeds a reference count. Here, "continuity count" or simply "count" refer to the number of consecutively received write blocks (among the sequential data) that have a size of data greater than or equal to a reference size. In the case where the continuity count of the sequential data is smaller than the reference count (No), in step S145, a write operation may be performed in a low speed. That is, the sequential data may be stored at the main region 1212. In contrast, in the case where the count of the sequential data is greater than or equal to the reference count (Yes), the method proceeds to step S140.

In step S140, the speed mode manager 1226 may change a speed mode from a low-speed mode to a high-speed mode. In the case where the continuity count of the sequential data is greater than the reference count, data may be stored at the buffer region 1211 in which a write operation is performed in a high speed.

FIG. 4 is a diagram schematically illustrating a mode change operation of a speed mode manager illustrated in FIG. 1. In FIG. 4, it is assumed that a reference size of data is 512 KB and a reference count of sequential data is "4".

In the case where first data (512 KB) is received, a write operation may be performed in a low-speed mode (S145) because its data size may be greater than or equal to a reference size (S120) but the continuity count of the sequential data is one (1) which is smaller than a reference count (S130). That is, the first data may be stored at a main region 1212 in which a write operation is performed in a low speed. Likewise, the continuity count of the second data (512 KB) and third data (512 KB) is two (2) and three (3) respectively, and this data may be also stored at the main region 1212 in which a low-speed write operation is carried out.

In the case where fourth data (512 KB) is received, its data size may be greater than or equal to the reference size (S120), and the continuity count of the sequential data become four (4) which is greater than or equal to the reference count. In this case, a speed mode manager 1226 may change a speed mode from a low-speed mode to a high-speed mode (S140). That is, the fourth data may be stored at a buffer region 1211 in which a write operation is performed in a high speed. Likewise, fifth data (512 KB) and sixth data (512 KB) may be also stored at the buffer region 1211 in which a high-speed write operation is carried out.

Figure 5:
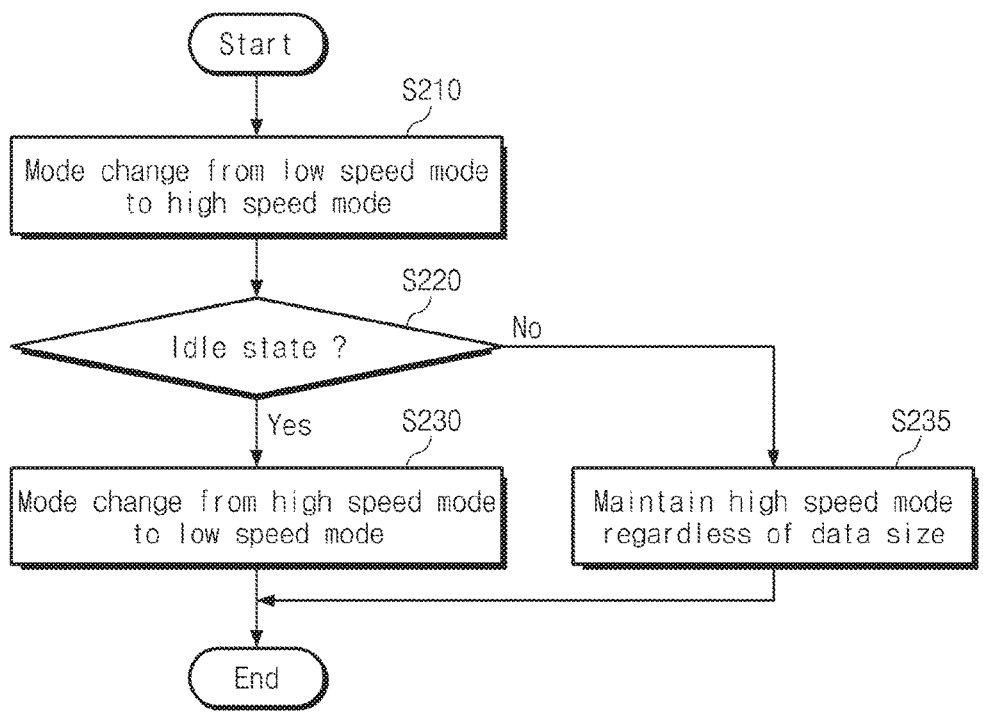
FIG. 5 is a flow chart for reference in describing an operation of changing a speed mode to a low-speed mode after a speed mode manager illustrated in FIG. 1 has changed the speed mode from the low-speed mode to a high-speed mode.

FIG. 5 is a flow chart for describing an operation of changing a speed mode to a low-speed mode after a speed mode manager illustrated in FIG. 1 changes the speed mode from the low-speed mode to a high-speed mode.

Step S210 may correspond to a mode change operation of a speed mode manager 1226 which is described with reference to step S140 of FIG. 3. That is, when data of which the size is greater than or equal to a reference size is sequentially received, the speed mode manager 1226 may change a speed mode from a low-speed mode to a high-speed mode. That is, data may be stored at a buffer region 1211 in which a high-speed write operation is performed.

In step S220, the speed mode manager 1226 may determine whether a state of a storage device 1200 is an idle state. That is, the speed mode manager 1226 may determine whether a write request is sequentially received from a host 1100 (refer to FIG. 1). If a write request is not received during a predetermined time (e.g., 100 ms), a state of the storage device 1200 may be determined as being the idle state. In the case where a state of the storage device 1200 is determined as not being the idle state, in step S235, the speed mode manager 1226 may continuously maintain a high-speed mode regardless of a data size. That is, data may be stored at a buffer region 1211 in which a high-speed write operation is performed. In contrast, in the case where a state of the storage device 1200 is determined as being the idle state, the method proceeds to step S230.

In step S230, the speed mode manager 1226 may change a speed mode from a high-speed mode to a low-speed mode. That is, if the storage device 1200 enters the idle state while operating in the high-speed mode, the speed mode manager 1226 may automatically change a speed mode to a low-speed mode. Data may be stored at a main region 1212 in which a low-speed write operation is performed.

Figure 6:
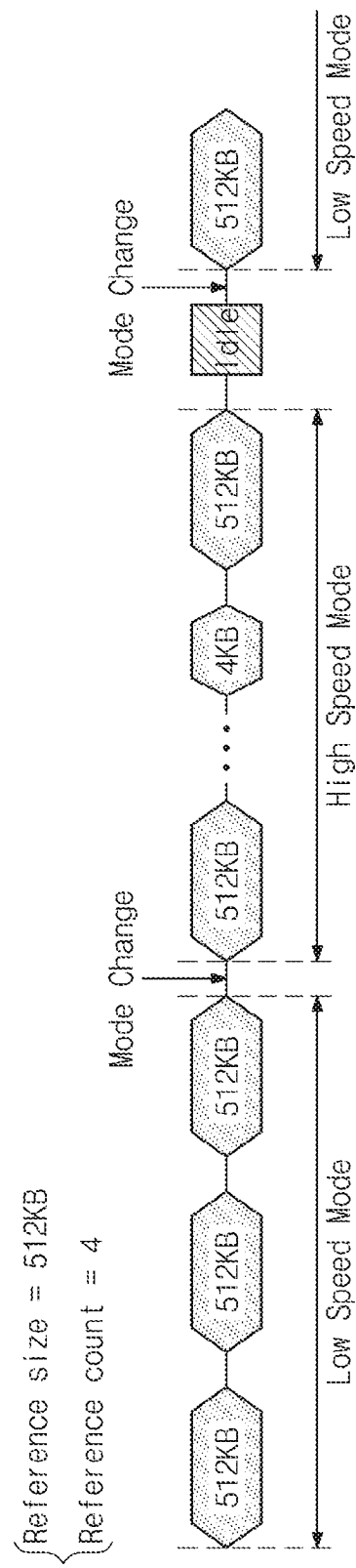
FIG. 6 is a diagram schematically illustrating an example of a mode change operation described in FIG. 5.

FIG. 6 is a diagram schematically illustrating a mode change operation described in FIG. 5. It is assumed that a reference size of data is 512 KB and a reference count of sequential data is 4.

As described with reference to FIG. 4, a storage device 1200 may operate in a low-speed mode when first to third data having a size of 512 KB is received. That is, the first to third data may be stored at a main region 1212 in which a low-speed write operation is performed. In the case where fourth data having a size of 512 KB is received, a speed mode manager 1226 may change a speed mode from a low-speed mode to a high-speed mode. The fourth data (512 KB) may be stored at a buffer region 1211 in which a high-speed write operation is performed.

After the speed mode is changed to the high-speed mode, sequential data may be stored at the buffer region 1211 in which the high-speed write operation is performed, regardless of a data size. For example, even though data of 4 KB smaller than the reference size is received, it may be stored at the buffer region 1211. Even though 512 KB data is received after 4 KB data is received, it may be stored at the buffer region 1211 without changing a speed mode.

Continuing to refer to FIG. 6, if a storage device 1200 enters an idle state while operating in the high-speed mode, a speed mode manager 1226 may automatically change the speed mode to the low-speed mode. 512 KB data received after the idle state may be stored at the main region 1212 in which the low-speed write operation is performed.

Figure 7:
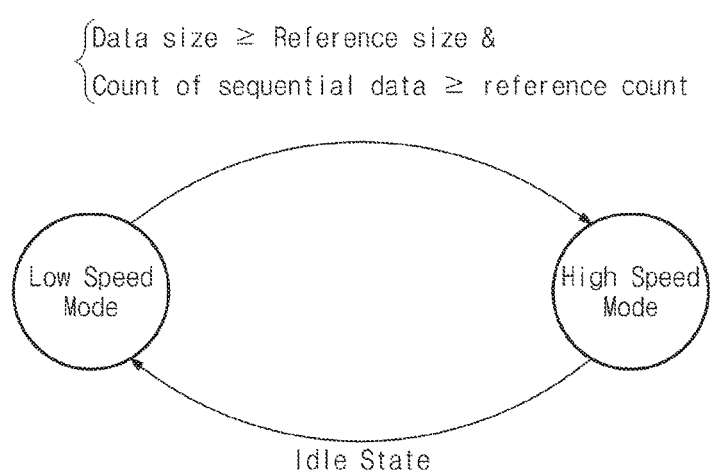
FIG. 7 is a state diagram for reference in describing a mode change operation of a speed mode manager illustrated in FIG. 1.

FIG. 7 is a state diagram for describing a mode change operation of a speed mode manager illustrated in FIG. 1. Referring to FIG. 7, a speed mode manager 1226 may change a speed mode between a low-speed mode and a high-speed mode. The high-speed mode may be carried out at a buffer region 1211, and the low-speed mode may be performed at a main region 1212. A write operation performed in the high-speed mode may be relatively faster than that performed in the low-speed mode. In other words, a write operation performed in the low-speed mode may be relatively slower than that performed in the high-speed mode.

Referring to FIG. 7, a mode change from the low-speed mode to the high-speed mode may be made according to data size and data continuity. A speed mode manager 1226 may change a speed mode from the low-speed mode to the high-speed mode when a count of sequentially received data having a size greater than or equal to a reference size is greater than or equal to a reference count. In the case where the speed mode is changed to the high-speed mode, data may be stored at the buffer region 1211 regardless of the size of data.

Meanwhile a mode change from the high-speed mode to the low-speed mode may be made according to an idle state. In the case where a state of a storage device 1200 is determined as being an idle state, the speed mode manager 1226 may change the speed mode from the high-speed mode to the low-speed mode. Once the speed mode is changed to the low-speed mode, data may be stored at the main region until a count of sequentially received data having a size greater than or equal to the reference size is greater than or equal to a reference count.

A user device according to an exemplary embodiment of the inventive concept may make write performance high instantaneously using the high-speed mode in the case where its write performance is low like a mobile electronic device. For example, it may be possible to enhance write performance in downloading a large file through a wireless communication network, storing a file from a USB, or shooting a picture, by a smart phone. A storage device according to an exemplary embodiment of the inventive concept may automatically change a speed mode from a low-speed mode to a high-speed mode without receiving a separate command for a change in the speed mode from a host.

Figure 8:
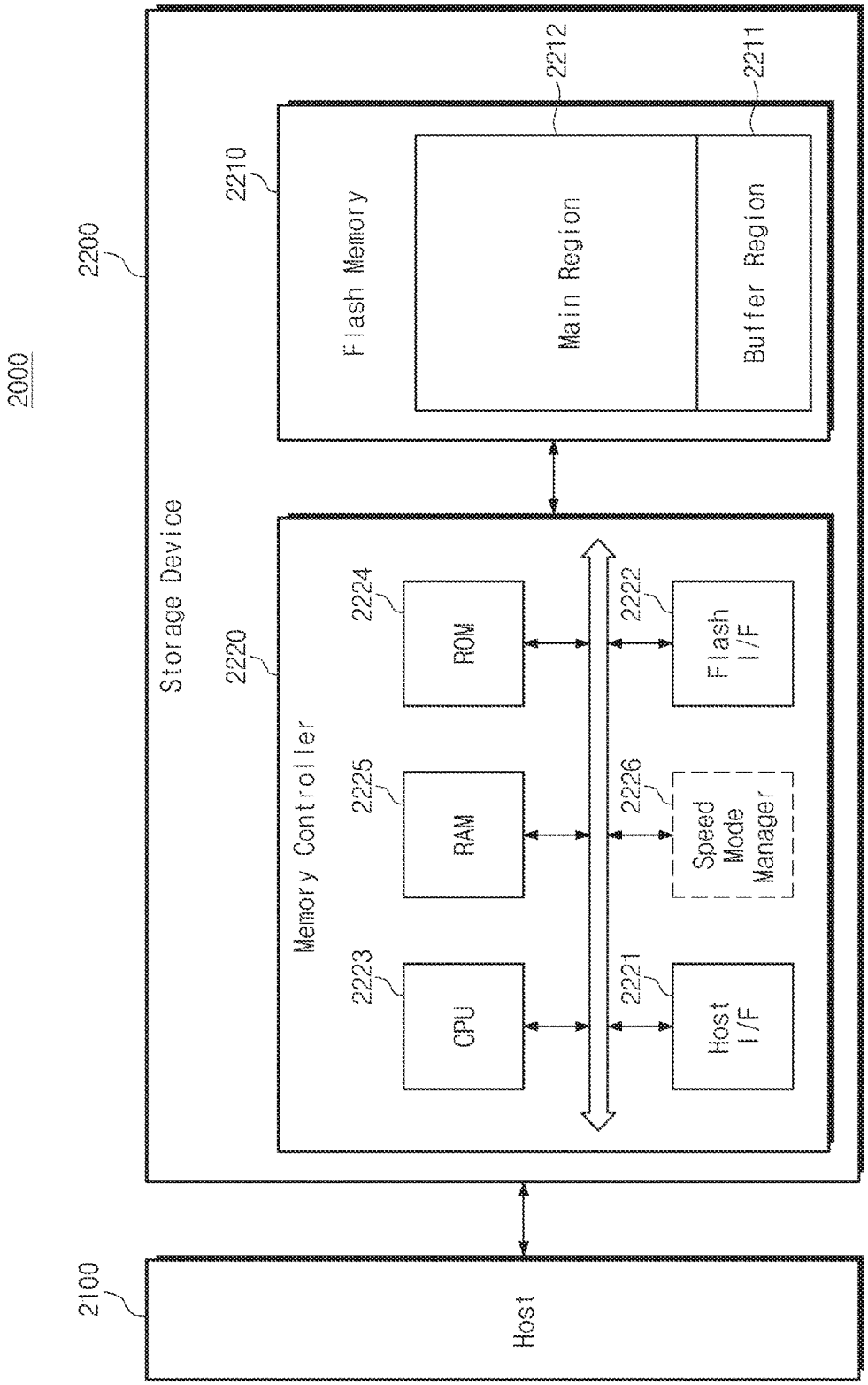
FIG. 8 is a block diagram schematically illustrating a user device according to another exemplary embodiment of the inventive concept.

FIG. 8 is a block diagram schematically illustrating a user device according to another exemplary embodiment of the inventive concept. Referring to FIG. 8, a user device 2000 may include a host 2100 and a storage device 2200. The storage device 2200 may include a flash memory 2210 and a memory controller 2220. The flash memory 2210 may contain a buffer region 2211 and a main region 2212. The buffer region 2211 may be implemented with a high-speed memory, and the main region 2212 may be implemented with a low-speed memory.

The high-speed memory may be configured to a mapping method suitable for a high-speed operation, and the low-speed memory may be configured to a mapping method suitable for a low-speed operation. For example, the main region 2212 forming the low-speed memory may be managed through a block mapping method, and the buffer region 2211 forming the high-speed memory may be managed through a page mapping method. The buffer region 2211 may operates in a high speed because the page mapping method does not need a merge operation causing lowering of operating performance (e.g., write performance). In contrast, the main region 2212 may operate in a relatively low speed because the block mapping method needs a merge operation causing lowering of operating performance (e.g., write performance).

Meanwhile, classification of a memory as a high-speed memory or a low-speed memory may be made according to the number of data bits stored at a memory cell. Generally, a write speed may become higher as the number of data bits stored at a memory cell increases. For example, a write speed of an SLC memory may be higher than that of an MLC memory. For example, a write speed of an SLC memory may be two times higher than that of a 2-bit MLC memory, and may be four times higher than that of a 3-bit MLC memory. In FIG. 8, the buffer region 2211 may be formed of an SLC memory, and the main region 2212 may be formed of an MLC memory.

Continuing to refer to FIG. 8, a memory controller 2220 may contain a host interface 2221, a flash interface 2222, a central processing unit (CPU) 2223, a ROM 2224, a RAM 2225, and a speed mode manager 2226.

The host interface 2221 may provide an interface with the host 2100. The flash interface 2222 may provide an interface with the flash memory 2210. The host interface 2221 may be coupled to the host 2100 through one or more channels (or ports).

For example, the host interface 2221 may be coupled to the host 2100 through one of two channels: a parallel AT attachment bus (PATA) and a serial AT attachment bus (SATA). Alternatively, the host interface 2221 may be coupled to an external device through a PATA bus and a SATA bus. Alternatively, the host interface 2221 may be coupled to an external device through a SCSI, USB, eMMC, or UFS (universal flash storage) interface.

The CPU 2223 may control an overall operation (e.g., a read operation, a write operation, file system management, FTL management, and the like). For example, firmware such as a flash translation layer (FTL) or the speed mode manager 2226 stored at the ROM 2224 may be driven under a control of the CPU 2223.

The RAM 2225 may operate in response to a control of the CPU 2223 and may be used as a work memory, a buffer memory, a cache memory, and the like. The RAM 2225 may be implemented with one chip or may be implemented with a plurality of chips corresponding to the buffer region 2211 or the main region 2212 of the flash memory 2210.

When used as the work memory, the RAM 2225 may temporarily store data that the CPU 2223 processes. When used as the buffer memory, the RAM 2225 may be used to buffer data that is transferred from the host 2100 to the flash memory 2210 or from the flash memory 2210 to the host 2100.

When used as the cache memory (hereinafter referred to as "caching"), the RAM 2225 may allow a low-speed flash memory 2210 to operate in a high speed. In the case of using the caching, file data stored at the RAM 2225 may be dumped into a buffer region 2211 of the flash memory 2210. The CPU 2223 may manage a mapping table according to a dump operation. The RAM 2225 may be used as a driving memory for driving a Flash Translation Layer (FTL). The FTL may be used to manage a merge operation, a mapping table, and the like of the flash memory 2210.

The memory controller 2220 may include the speed mode manager 2226. The speed mode manager 2226 may be implemented with software, firmware, hardware, or a combination of at least two thereof. If being software or firmware, the speed mode manager 2226 may run on the RAM 2225.

Figure 9:
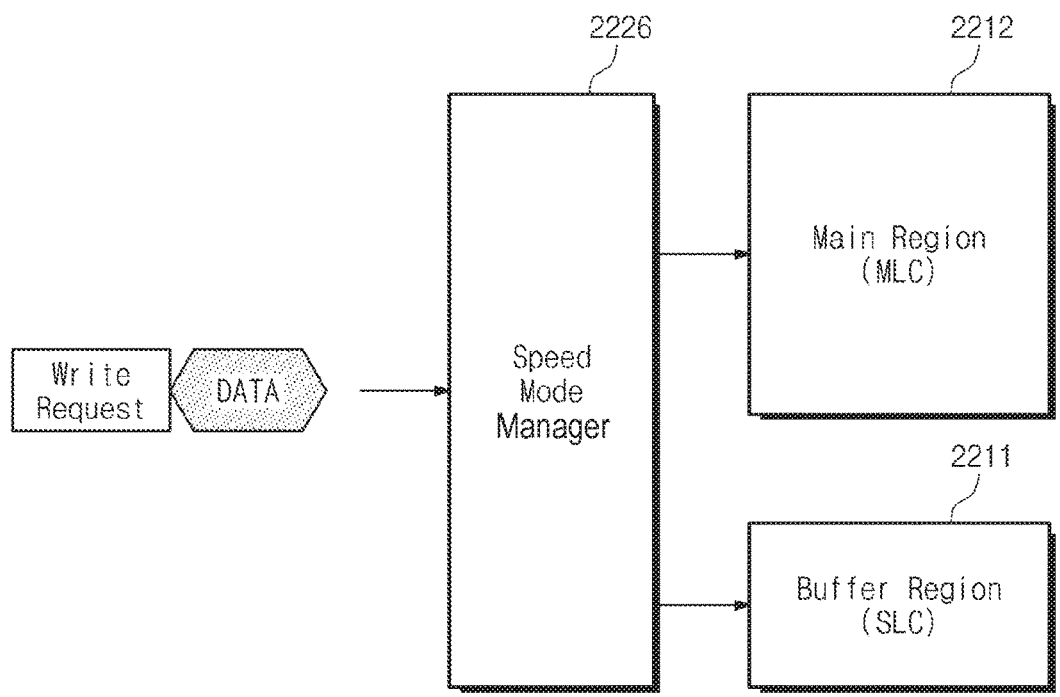
FIGS. 9 and 10 are block diagrams for reference in exemplarily describing an operation of a speed mode manager illustrated in FIG. 8.
Figure 10:
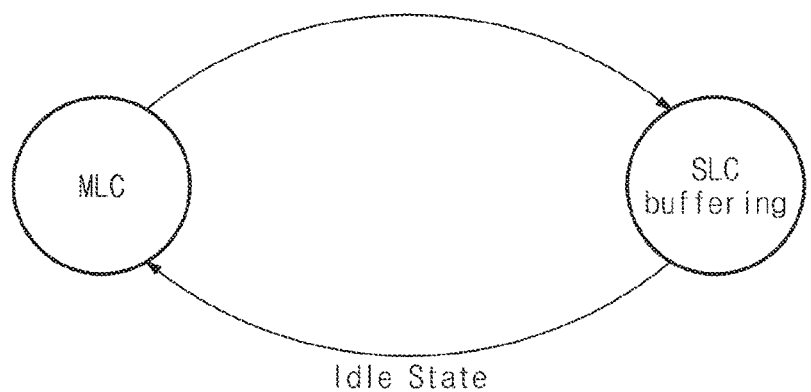

FIGS. 9 and 10 are block diagrams for exemplarily describing an operation of a speed mode manager illustrated in FIG. 8. Referring to FIG. 9, a speed mode manager 2226 may receive a write request and data from a host 2100 (refer to FIG. 8). The write request may include a command index indicating a write command, a write address, a data size, and other information.

The speed mode manager 2226 may receive the write request of the host 2100 and may store the input data at a buffer region 2211 or a main region 2212 using information such as data size, data continuity, and the like. For example, the speed mode manager 2226 may change a speed mode from a low-speed mode to a high-speed mode when a count of sequentially received data having a size greater than or equal to a reference size is greater than or equal to a reference count. If a speed mode is changed to the high-speed mode, the sequentially input data may be stored at the buffer region 2211 regardless of the data size.

In exemplary embodiments, the buffer region 2211 may be an SLC memory in which a high-speed write operation is performed. Storing of data at the buffer region 2211 may be referred to as "buffering". In the case where mass data is sequentially received, a user device 2000 according to an exemplary embodiment of the inventive concept may store data at the buffer region (e.g., SLC) 2211 to enhance write performance.

Referring to FIG. 10, when the storage device 2000 enters an idle state while performing SLC buffering, the speed mode manager 2226 may change a speed mode from a high-speed mode to a low-speed mode. That is, data received after the idle state may be stored at the main region 2212. In exemplary embodiments, the main region 2212 may be an MLC flash memory in which a low-speed write operation is performed.

Figure 11:
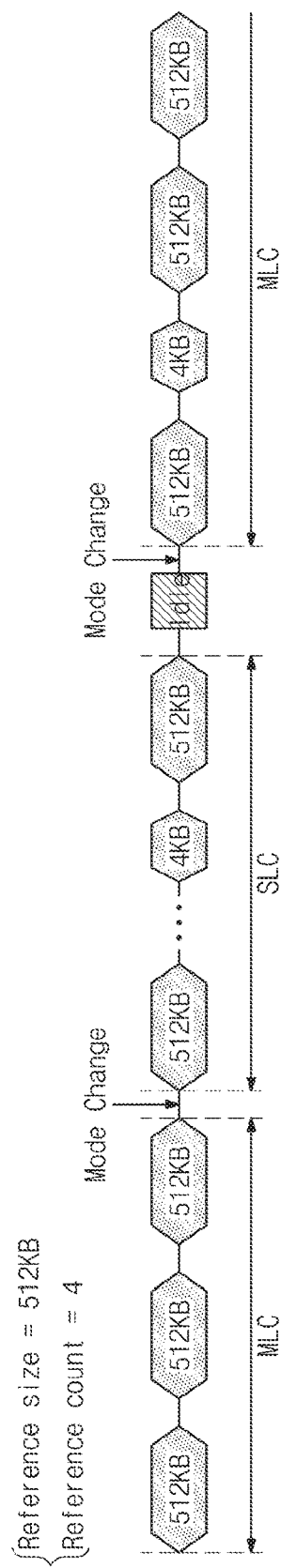
FIG. 11 is a diagram schematically illustrating an example of a change in a speed mode illustrated in FIG. 10.

FIG. 11 is a diagram schematically illustrating a change in a speed mode illustrated in FIG. 10. It is assumed that a reference size of data is 512 KB and a reference count of sequential data is 4.

Referring to FIG. 11, first to third data having a size of 512 KB may be received. The first to third data may be stored at an MLC flash memory in which a low-speed write operation is performed. In the case where fourth data having a size of 512 KB is received, a speed mode manager 2226 may change a speed mode from a low-speed mode to a high-speed mode. The fourth data may be stored at an SLC flash memory in which a high-speed write operation is performed.

After the speed mode is changed to the high-speed mode, sequential data may be stored in the high-speed mode regardless of the data size. For example, a write operation may be performed in the high-speed mode even though data having a size of 4 KB is received. That is, the 4 KB data may be stored at the SLC flash memory. 512 KB data received after the 4 KB data is received may be also stored at the SLC flash memory without a mode change.

Continuing to refer to FIG. 11, the speed mode manager 2226 may change the speed mode to the low-speed mode if a storage device 2000 enters an idle state while operating in the high-speed mode. 512 KB data received after the idle state may be stored at the MLC flash memory in which the low-speed write operation is performed.

Once changed to the low-speed mode, the speed mode may be changed to the high speed only if a count of sequentially received data having a size greater than or equal to a reference size is greater than or equal to a reference count. As illustrated in FIG. 11, in the case where 4 KB data of which the size is smaller than the reference size is received in the middle, the speed mode may be changed to the high-speed mode only if a count of newly and sequentially received data having a size greater than or equal to a reference size is greater than or equal to a reference count.

Figure 12:
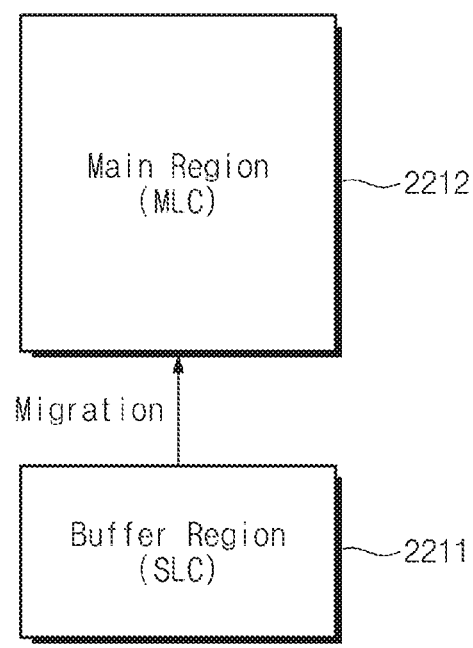
FIG. 12 is a block diagram for reference in describing a migration operation of a flash memory illustrated in FIG. 8.

FIG. 12 is a block diagram schematically illustrating a migration operation of a flash memory illustrated in FIG. 8. Data stored at a buffer region 2211 of a flash memory 2210 may be migrated into a main region 2212. Transferring of data from the buffer region 2211 to the main region 2212 may be referred to as a "migration operation".

The migration operation may be executed through various methods. For example, the migration operation may start according to whether a free space of the buffer region 2211 is smaller than or equal to a predetermined space (e.g., 30%). Alternatively, the migration operation may start periodically. Alternatively, the migration operation may start according to a result of sensing an idle time of the flash memory 2210.

In the case where a user device according to an exemplary embodiment of the inventive concept includes a storage device with low write speed performance, it is possible to enhance write performance instantaneously by changing a write speed mode from a low-speed mode to a high-speed mode. A storage device according to an exemplary embodiment of the inventive concept may automatically change the speed mode from the low-speed mode to the high-speed mode without receiving a separate command for a write speed mode change from a host.

Meanwhile, a user device according to an embodiment of the inventive concept may be applicable to a variety of products. The user device according to an embodiment of the inventive concept may be an electronic device, such as a personal computer, a digital camera, a camcorder, a handheld telephone, an MP3 player, a portable media player (PMP), a PlayStation player (PSP), a personal digital assistant (PDA), and the like. A storage device may be implemented with a storage medium, such as a memory card, a USB memory, a Solid State Drive (SSD), or the like.

Figure 13:
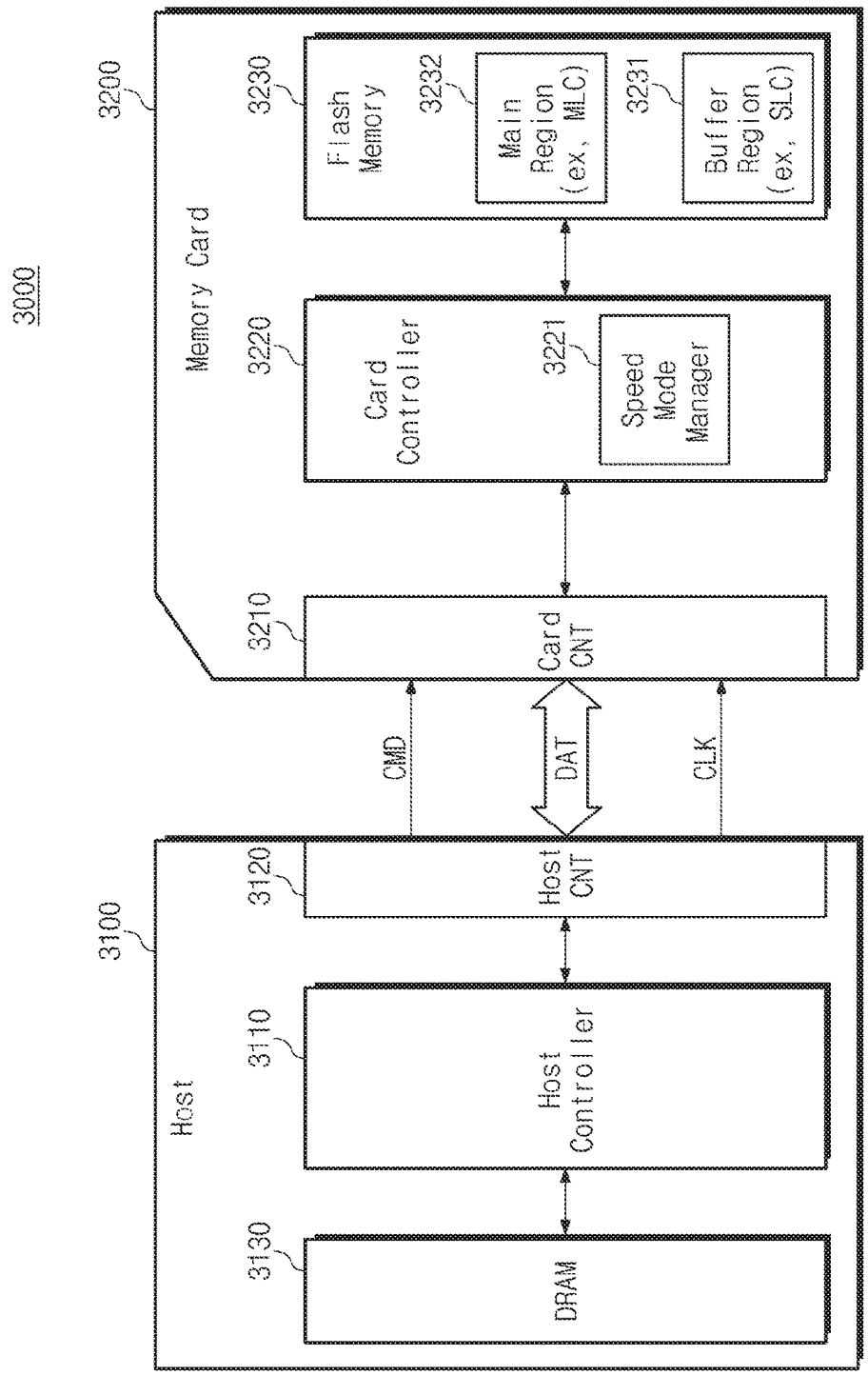
FIG. 13 is a block diagram schematically illustrating a memory card system including a user device according to an exemplary embodiment of the inventive concept.

FIG. 13 is a block diagram schematically illustrating a memory card system including a user device according to an exemplary embodiment of the inventive concept. A memory card system 3000 may include a host 3100 and a memory card 3200. The host 3100 may include a host controller 3110, a host connection unit 3120, and a DRAM 3130.

The host 3100 may write data in the memory card 3200 and may read data from the memory card 3200. The host controller 3110 may send a command (e.g., a write command), a clock signal CLK generated from a clock generator (not shown) in the host 3100, and data to the memory card 3200 through the host connection unit 3120. The DRAM 3130 may be a main memory of the host 3100.

The memory card 3200 may include a card connection unit 3210, a card controller 3220, and a flash memory 3230. The card controller 3220 may store data at the flash memory 3230 in response to a command input through the card connection unit 3210. The data may be stored in synchronization with a clock signal generated from a clock generator (not shown) in the card controller 3220. The flash memory 3230 may store data transferred from the host 3100. For example, in a case where the host 3100 is a digital camera, the flash memory 3230 may store image data.

In the memory card system 3000 illustrated in FIG. 13, the card controller 3220 may contain a speed mode manager 3221. The flash memory 3230 may include a buffer region (e.g., an SLC memory) 3231 in which a high-speed write operation is performed and a main region (e.g., an MLC memory) 3232 in which a low-speed write operation is performed. The memory card system according to an exemplary embodiment of the inventive concept may enhance write performance instantaneously by changing a speed mode to a high-speed mode.

Figure 14:
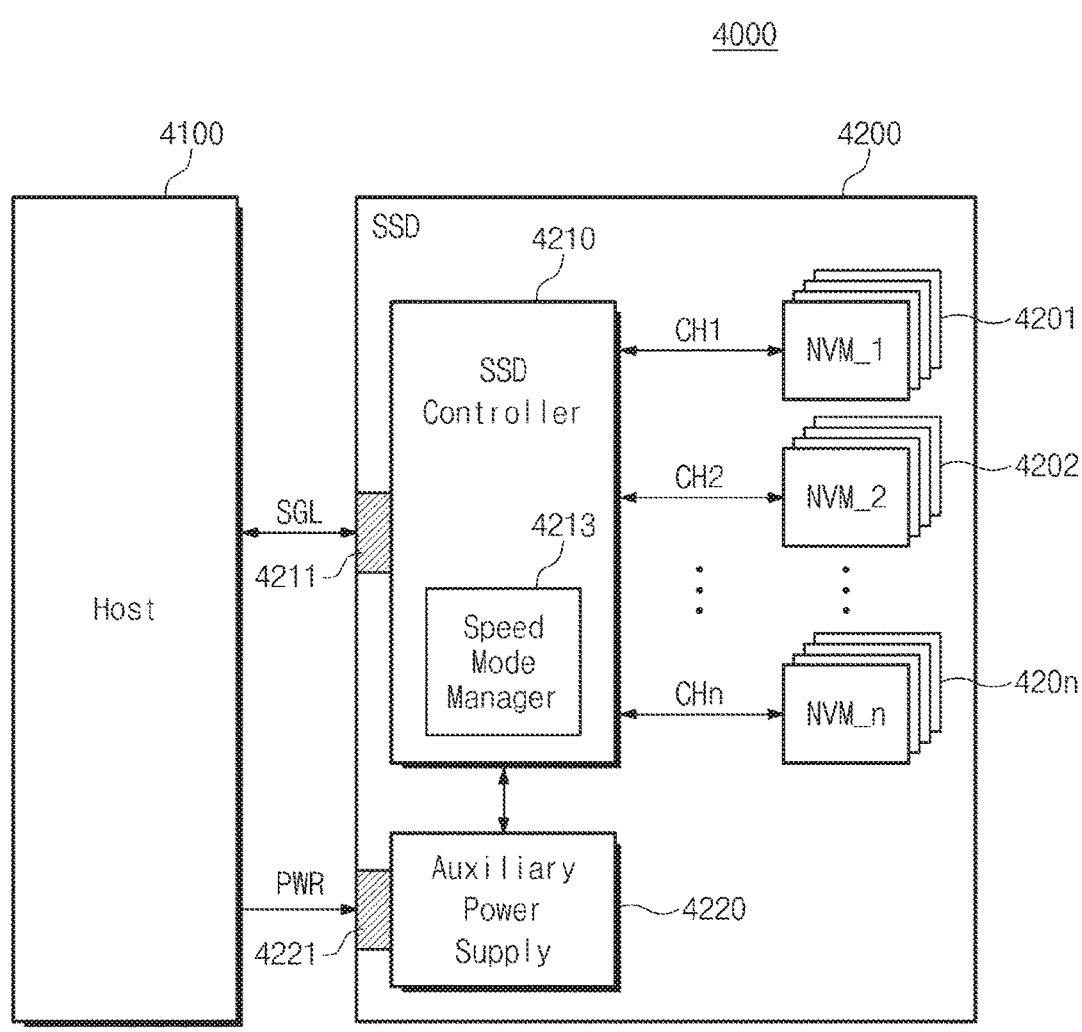
FIG. 14 is a block diagram schematically illustrating a solid state drive system to which a user device according to an exemplary embodiment of the inventive concept is applied.

FIG. 14 is a block diagram schematically illustrating a solid state drive system to which a user device according to an exemplary embodiment of the inventive concept is applied. Referring to FIG. 14, a solid state drive (SSD) system 4000 may include a host 4100 and an SSD 4200. The host 4100 may write data at the SSD 4200 or may read data from the SSD 4200. The host controller 4210 may transfer a signal SGL, including a command, an address, a control signal, and the like, to the SSD 4200 through the host interface 4211 (i.e., signal connector).

The SSD 4200 may exchange signals SGL with the host 4100 through the host interface (signal connector) 4211 and may be supplied with a power through a power connector 4221. The SSD 4200 may include a plurality of nonvolatile memories 4201 through 420n, an SSD controller 4210, and an auxiliary power supply 4220. Herein, the nonvolatile memories 4201 to 420n may be implemented with a PRAM, a MRAM, a ReRAM, a FRAM, and the like as well as a NAND flash memory.

The plurality of nonvolatile memories 4201 through 420n may be used as a storage medium of the SSD 4200. The flash memories 4201 through 420n may be connected with the SSD controller 4210 through a plurality of channels CH1 through CHn. One channel may be connected with one or more flash memories. Flash memories connected with one channel may be connected with the same data bus.

The SSD controller 4210 may exchange signals SGL with the host 4100 through the signal connector 4211 (i.e., host interface). The signals SGL may include the following: a command, an address, and data. The SSD controller 4210 may be configured to write or read out data to or from a corresponding flash memory in response to a command of the host 4100. The SSD controller 4210 may contain a speed mode manager 4213 therein.

The auxiliary power supply 4220 may be connected with the host 4100 through the power connector 4221. The auxiliary power supply 4220 may be charged by a power PWR from the host 4100. The auxiliary power supply 4220 may be placed inside or outside the SSD 4200. For example, the auxiliary power supply 4220 may be put on a main board to supply an auxiliary power to the SSD 4200.

Figure 15:
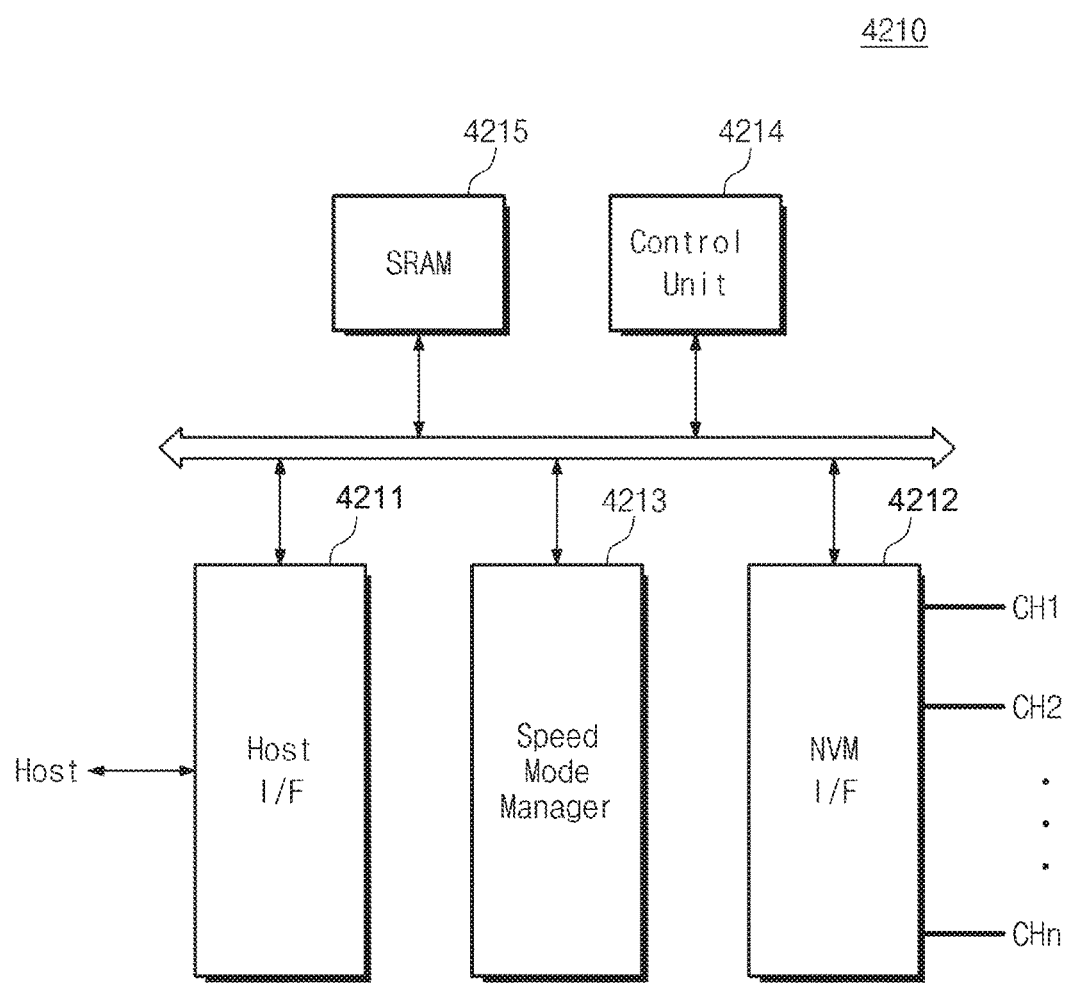
FIG. 15 is a block diagram schematically illustrating an SSD controller shown in FIG. 14.

FIG. 15 is a block diagram schematically illustrating an SSD controller shown in FIG. 14. Referring to FIG. 15, an SSD controller 4210 may include a host interface 4211, an NVM interface 4212, a speed mode manager 4213, a central processing unit (CPU) 4214 (i.e., control unit), and a SRAM 4215 (i.e., buffer memory).

The NVM interface 4212 may scatter data transferred from the buffer memory 4215 into channels CH1 through CHn . The NVM interface 4212 may transfer data read from flash memories 4201 through 420n to the buffer memory 4215.

The host interface 4211 may provide an interface with an SSD 4200 in compliance with the protocol of the host 4100. The host interface 4211 may communicate with the host 4100 using USB (Universal Serial Bus), SCSI (Small Computer System Interface), PCI express, ATA, PATA (Parallel ATA), SATA (Serial ATA), SAS (Serial Attached SCSI), and the like. The host interface 4211 may also perform disk emulation which enables the host 4100 to recognize the SSD 4200 as a hard disk drive (HDD).

The speed mode manager 4213 may change a speed mode of nonvolatile memories 4201 to 420n as described above. The CPU 4214 may analyze and process signals received from a host 4100 (refer to FIG. 17). The CPU 4214 may control the host 4100 through the host interface 4211 or the flash memories 4201 through 420n through the NVM interface 4212. The CPU 4214 may control the flash memories 4201 through 420n using firmware for driving an SSD 4200.

The SRAM 4215 may be used to drive software for efficient management of the nonvolatile memories 4201 to 420n. Furthermore, the SRAM 4215 may store metadata provided from a main memory the host 4100 or cache data. At sudden power-off, the metadata or cache data stored at the SRAM 4215 may be stored at the flash memories 4201 through 420n using an auxiliary power supply 4220.

Returning to FIG. 14, an SSD system 4000 according to an exemplary embodiment of the inventive concept may instantaneously enhance write performance through a speed mode change between a buffer region and a main region of the nonvolatile memories 4201 to 420n or each of the nonvolatile memories 4201 to 420n.

Figure 16:
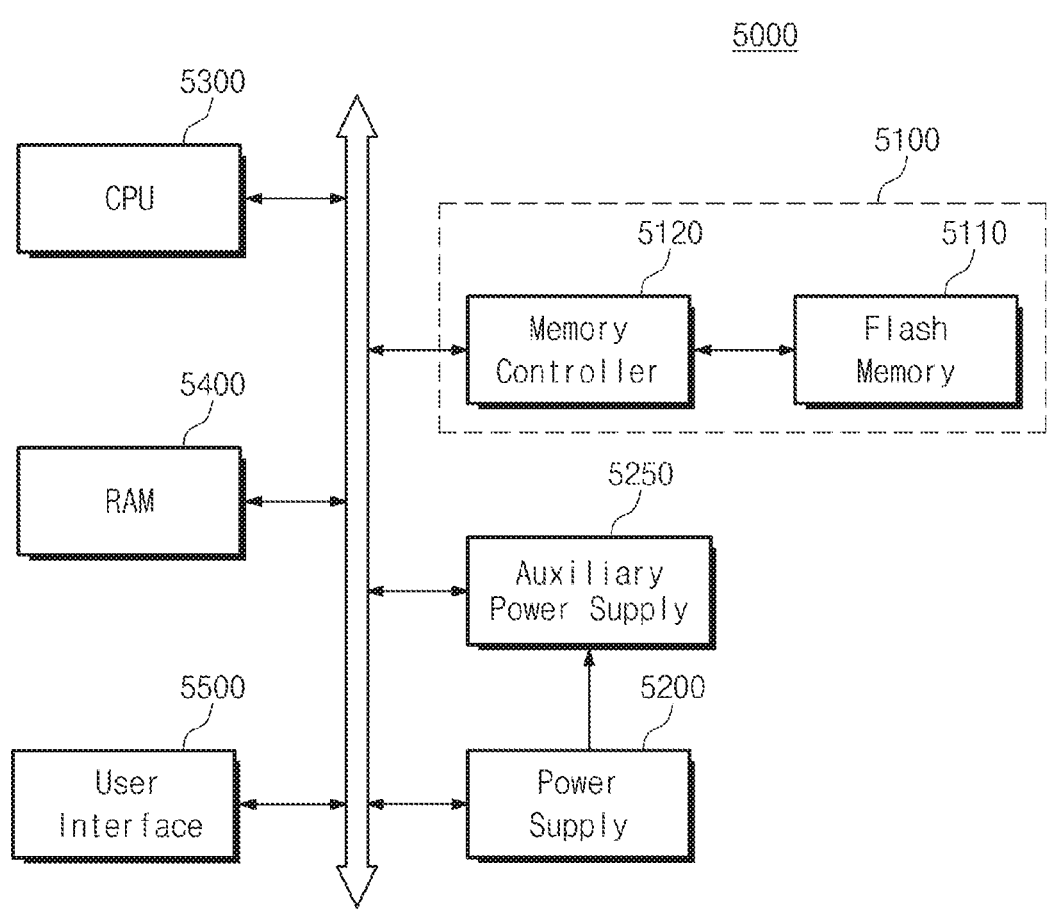
FIG. 16 is a block diagram schematically illustrating an electronic device including a memory system according to an exemplary embodiment of the inventive concept.

FIG. 16 is a block diagram schematically illustrating an electronic device including a memory system according to an exemplary embodiment of the inventive concept. An electronic device 5000 may be implemented with a personal computer or with handheld electronic devices, such as a notebook computer, a cellular phone, a PDA, and a camera.

Referring to FIG. 16, the electronic device 5000 may include a memory system 5100, a power supply 5200, an auxiliary power supply 5250, a central processing unit (CPU) 5300, a random access memory (RAM) 5400, and a user interface 5500. The memory system 5100 may contain a flash memory 5110 and a memory controller 5120.

As described above, the electronic device 5000 according to an exemplary embodiment of the inventive concept may enhance write performance through a speed mode change between a buffer region and a main region of the flash memory 5110.

A user device according to an exemplary embodiment of the inventive concept may include a portable terminal and a fixed terminal. Herein, the portable terminal may be a portable electronic device easy to carry and may be a video phone, a cellular phone, an IMT-2000 (International Mobile Telecommunication 2000) terminal, a WCDMA terminal, an UMTS (Universal Mobile Telecommunication Service) terminal, a PDA (Personal Digital Assistant), a PMP (Portable Multimedia Player), a DMB (Digital Multimedia Broadcasting) terminal, E-Book, a portable computer (e.g., a notebook computer, a tablet PC, or the like), a digital camera, or the like. The fixed terminal may be a desktop personal computer or the like.

Figure 17:
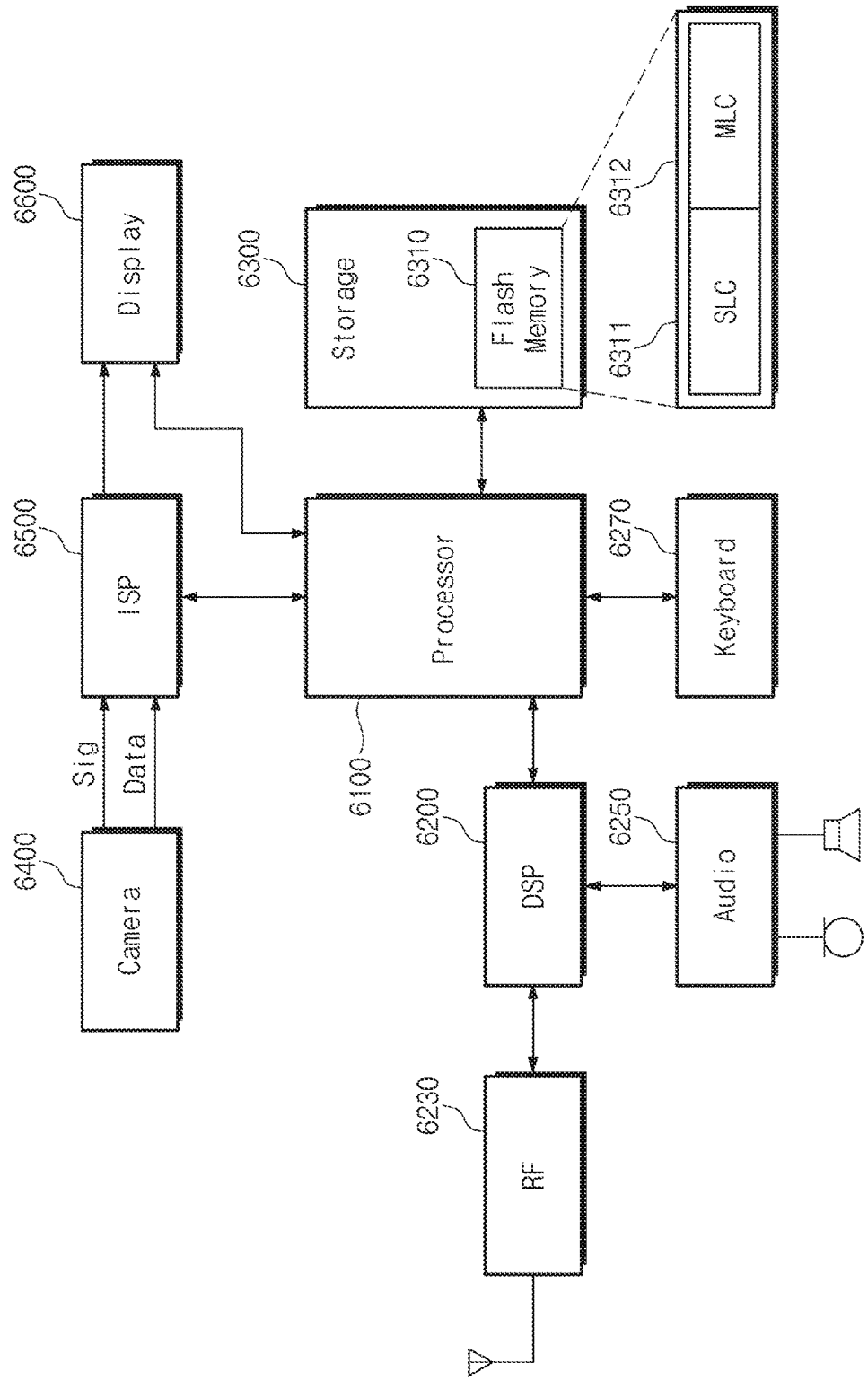
FIG. 17 is a block diagram schematically illustrating a terminal according to an exemplary embodiment of the inventive concept.

FIG. 17 is a block diagram schematically illustrating a terminal according to an exemplary embodiment of the inventive concept. Referring to FIG. 17, an RF unit 6230 may perform a wireless communication function of a terminal. Although not illustrated, the RF unit 6230 may include an RF transmitter for performing amplification and upward tuning about a frequency of a transmitted signal, an RF receiver for performing low-noise amplification about a received signal and downward tuning about a frequency of the received signal, and the like.

Although not illustrated, a data signal processing unit (DSP) 6200 may include a transmitter for encoding and modulating a signal to be transmitted, a receiver for decoding and demodulating a received signal, and the like. That is, the data signal processing unit 6200 may include a modem and a codec. Herein the codec may include a data codec for processing packet data and the like and an audio codec for processing an audio signal such as a voice and the like.

An audio processing unit 6250 may reproduce audio data from the audio codec of the data signal processing unit 6200 or may transfer a transmission audio signal from a microphone to the audio codec of the data signal processing unit 6200.

A keyboard 6270 may include keys for inputting number and character information and function keys for setting various functions. A camera unit 6400 may capture image data and may include a camera sensor for converting a captured light signal into an electrical signal and a signal processing unit for converting an analog image signal from a camera sensor into digital data. Herein, assuming that the camera sensor is a CCD or CMOS sensor, the signal processing unit may be implemented with a digital signal processor (DSP). Furthermore, the camera sensor and the signal processing unit may be integrated in one component or may be implemented with separated components.

The image processing unit 6500 may perform image signal processing (ISP) for displaying an image signal from the camera unit 6400 on a display unit 6600 and may have the following functions: gamma correction, interpolation, spatial change, image effect, image scale, Auto While Balance (AWB), Auto Exposure (AE), Auto Focus (AF), and the like. Accordingly, the image processing unit 6500 may process an image signal from the camera unit 6400 by the frame and may output frame image data to be fit to the characteristic and size of the display unit 6600. Furthermore, the image processing module 6500 may have an image codec and may compress frame image data to be displayed on the display unit 6600 in a predetermined manner or may decompress compressed frame image data to original frame image data. Herein, the image codec may be JPEG codec, MPEG4 codec, Wavelet codec, or the like. Assuming that the image processing unit 6500 has an OSD (On Screen Display) function, it may output OSD data according to the size of screen to be displayed under a control of a processor 6100.

The display unit 6600 may display an image signal from the image processing unit 6500 on screen and may display user data from the processor 6100. Herein, the display unit 6600 may be an LCD. In this case, the display unit 6600 may contain an LCD controller, a memory for storing image data, an LED display device, and the like. Herein, in the case where the LCD is implemented in the form of OSD, it may be used as an input unit. At this time, keys such as a keyboard 6270 may be displayed on the display unit 6600.

Storage 6300 may include a flash memory 6310. The flash memory 6310 may include an SLC region 6311 in which a high-speed write operation is performed and an MLC region 6312 in which a low-speed write operation is performed. The storage 6300 may store programs that allow mass data, necessitating high-speed storage, to be stored at the SLC region 6311 of the flash memory 6310 without receiving a separate command from the processor 6100. Furthermore, at an idle state, the storage 6300 may store programs that allow data to be stored at the MLC region 6312 through a speed change.

The inventive concept may automatically change a speed mode without receiving a separate command for designating a high-speed mode and a low-speed mode. As the speed mode is changed according to the size and continuity of data provided from a host, the write performance of a user device or a storage device may be improved.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A storage device comprising:
   a nonvolatile memory including a buffer region and a main region; and
   a memory controller responsive to a write request to store successively received blocks of write data at the nonvolatile memory,
   wherein the memory controller is configured to initially store blocks among the successively received blocks of write data in the main region of the nonvolatile memory, and to subsequently store remaining blocks among the successively received blocks of write data in the buffer region when a continuity count equals or exceeds a reference count,
   wherein the continuity count denotes a number of times a data size of the successively received blocks consecutively equals or exceeds a reference data size.

2. The storage device of claim 1, wherein N-bit data is stored at each memory cell of the buffer region, and M-bit data is stored at each memory cell of the main region, where N and M are integers and M>N.

3. The storage device of claim 1, wherein the memory controller comprises:
   a mode manager configured to change a write mode between a first mode in which data is stored at the buffer region and a second mode in which data is stored at the main region.

4. The storage device of claim 3, wherein a write speed of the first mode is greater than a write speed of the second mode,
   wherein the mode manager changes the write mode to the first mode when the continuity count equals or exceeds the reference count, and
   wherein the mode manager changes the write mode to the second mode at an idle state.

5. The storage device of claim 4, wherein, after the mode manager changes the write mode to the first mode and in absence of the idle state, the memory controller maintains the first mode regardless of a data size of all of remaining blocks among the successively received blocks of write data.

6. The storage device of claim 1, wherein the memory controller is configured to perform a migration operation in which data stored at the buffer region is transferred to the main region.

7. The storage device of claim 6, wherein the memory controller is configured to perform the migration operation during an idle time.

8. The storage device of claim 1, wherein the nonvolatile memory is a flash memory having a three-dimensional memory array.

9. A storage device comprising:
   a flash memory including a buffer region and a main region; and
   a memory controller responsive to a write request to store each of successively received blocks of write data at the buffer region when a continuity count equals or exceeds a reference count, wherein the continuity count denotes a number of times a data size of the successively received blocks of write data consecutively equals or exceeds a reference size.

10. The storage device of claim 9, wherein the memory controller changes from a second mode in which the successively received blocks of write data are initially stored in the main region to a first mode in which remaining successively received blocks of write data are stored in the buffer region when the continuity count equals or exceeds the reference count.

11. The storage device of claim 10, wherein, after an occurrence of an idle state, the memory controller changes to the second mode for execution of a next write request.

12. The storage device of claim 10, wherein, in absence of the idle state and after the memory controller changes to the first mode, the memory controller maintains the first mode for storing the remaining successively received blocks of write data in the buffer region regardless of a data size of the remaining successively received blocks of write data.

13. The storage device of claim 9, wherein N-bit data is stored at each memory cell of the buffer region, and M-bit data is stored at each memory cell of the main region, where N and M are integers and M>N.

14. The storage device of claim 9, wherein the memory controller comprises:
a speed mode manager configured to change between a first write speed mode in which the write data is stored at the buffer region and a second write speed mode in which the write data is stored at the main region.

15. The storage device of claim 14, wherein the speed mode manager changes from the first write speed mode to the second write speed mode after an occurrence of an idle state.

16. A user device comprising:
a host configured to provide a write request and successive blocks of write data; and
a storage device configured to receive the write request and the successive blocks of write data from the host, and to store the successive blocks of write data at a buffer region or a main region of a flash memory, and
wherein the storage device is configured to initially store blocks among the received successive blocks of write data in the main region of the flash memory, and to subsequently store remaining blocks among the received successive blocks of write data in the buffer region of the flash memory when a continuity count equals or exceeds a reference count,
wherein the continuity count denotes a number of times a data size of the received successive blocks of write data consecutively equals or exceeds a reference data size.

17. The user device of claim 16, wherein the storage device comprises:
a mode manager configured to change a write mode between a first mode in which data is stored at the buffer region and a second mode in which data is stored at the main region.

18. The user device of claim 17, wherein a write speed of the first mode is greater than a write speed of the second mode,
wherein the mode manager changes the write mode to the first mode when the continuity count equals or exceeds the reference count, and
wherein the mode manager changes the write mode to the second mode at an idle state.

19. The user device of claim 18, wherein, after the mode manager changes the write mode to the first mode and in absence of the idle state, the storage device maintains the first mode regardless of a data size of all of the remaining blocks among the received successive blocks of write data.

20. The user device of claim 16, wherein the host and the storage device constitute a mobile electronic device.

* * * * *